United States Patent
Dsilva et al.

(10) Patent No.: US 12,185,462 B2
(45) Date of Patent: Dec. 31, 2024

(54) CAPACITIVE COMPENSATION FOR VERTICAL INTERCONNECT ACCESSES

(71) Applicant: Achronix Semiconductor Corporation, Santa Clara, CA (US)

(72) Inventors: Hansel Desmond Dsilva, Maharashtra (IN); Sasikala J, Tamilnadu (IN); Abhishek Jain, New Dehli (IN); Amit Kumar, Noida (IN)

(73) Assignee: Achronix Semiconductor Corporation, Santa Clara, CA (US)

( * ) Notice: Subject to any disclaimer, the term of this patent is extended or adjusted under 35 U.S.C. 154(b) by 220 days.

(21) Appl. No.: 17/690,275

(22) Filed: Mar. 9, 2022

(65) Prior Publication Data

US 2022/0201857 A1    Jun. 23, 2022

Related U.S. Application Data

(63) Continuation of application No. 17/078,471, filed on Oct. 23, 2020, now Pat. No. 11,324,119.

(51) Int. Cl.
*G01R 27/16*    (2006.01)
*H05K 1/02*    (2006.01)
(Continued)

(52) U.S. Cl.
CPC .............. *H05K 1/115* (2013.01); *G01R 27/16* (2013.01); *H05K 1/0245* (2013.01);
(Continued)

(58) Field of Classification Search
CPC .... G01R 27/16; H05K 1/0221; H05K 1/0245; H05K 1/0251; H05K 1/0298;
(Continued)

(56) References Cited

U.S. PATENT DOCUMENTS

| | | |
|---|---|---|
| 6,787,710 B2 | 9/2004 | Uematsu et al. |
| 8,363,707 B2 * | 1/2013 | Hollis .................. G09G 5/006 455/283 |

(Continued)

FOREIGN PATENT DOCUMENTS

| | | |
|---|---|---|
| CN | 116670938 A | 8/2023 |
| WO | WO-2022086671 A1 | 4/2022 |

OTHER PUBLICATIONS

Via Charact & Modeling by Z Input Impedance _Lee et al._ 1-13_Jun. 2018.*

(Continued)

*Primary Examiner* — Timothy J Thompson
*Assistant Examiner* — Guillermo J Egoavil
(74) *Attorney, Agent, or Firm* — Schwegman Lundberg & Woessner, P.A.

(57) ABSTRACT

Multiple designs for a multi-layer circuit may be simulated to determine impedance profiles of each design, allowing a circuit designer to select a design based on the impedance profiles. One feature that can be modified is the structure surrounding the barrels of a differential VIA on layers that are not connected to the differential VIA. Specifically, one antipad can be used that surrounds both barrels or two antipads can be used, with one antipad for each barrel. Additionally, the size of the antipad or antipads can be modified. These modifications affect the impedance of the differential VIA. Additionally, a conductive region may be placed that connects to the VIA barrel even though the circuit on the layer does not connect to the VIA. This unused pad, surrounded by a non-conductive region, also affects the impedance of the differential VIA.

6 Claims, 10 Drawing Sheets

(51) Int. Cl.
| | |
|---|---|
| *H05K 1/11* | (2006.01) |
| *H05K 3/00* | (2006.01) |
| *H05K 3/04* | (2006.01) |
| *H05K 3/40* | (2006.01) |
| *H05K 3/42* | (2006.01) |
| *H05K 3/46* | (2006.01) |

(52) U.S. Cl.
CPC ......... *H05K 1/0251* (2013.01); *H05K 1/0298* (2013.01); *H05K 1/116* (2013.01); *H05K 3/0002* (2013.01); *H05K 3/046* (2013.01); *H05K 3/4038* (2013.01); *H05K 3/429* (2013.01); *H05K 3/46* (2013.01); *H05K 2203/16* (2013.01); *Y10T 29/49165* (2015.01)

(58) Field of Classification Search
CPC .......... H05K 1/115; H05K 1/116; H05K 1/02; H05K 1/11; H05K 3/00; H05K 2201/096; H05K 2201/09636; H05K 2203/16; H05K 3/0002; H05K 3/046; H05K 3/4038; H05K 3/429; H05K 3/46; H05K 3/4602; H05K 3/4611; H05K 3/04; H05K 3/40; H05K 3/42; H05K 1/117; Y10T 29/49165; G06F 13/4221; G06F 2213/0026; H04B 15/00; H04L 25/0276
USPC ............ 174/262; 327/65; 375/222; 455/283, 455/500
See application file for complete search history.

(56) References Cited

U.S. PATENT DOCUMENTS

| | | | |
|---|---|---|---|
| 10,194,524 B1* | 1/2019 | Park ....................... H05K 1/116 |
| 11,324,119 B1 | 5/2022 | Dsilva et al. |
| 2002/0179332 A1 | 12/2002 | Uematsu et al. |
| 2005/0225955 A1 | 10/2005 | Grebenkemper et al. |
| 2006/0118329 A1 | 6/2006 | Nakamura |
| 2007/0294890 A1 | 12/2007 | Gisin et al. |
| 2008/0160723 A1 | 7/2008 | Hannebauer |
| 2008/0250377 A1 | 10/2008 | Bird et al. |
| 2010/0255690 A1* | 10/2010 | Waite ...................... H05K 1/144 439/91 |
| 2011/0203843 A1* | 8/2011 | Kushta ................. H05K 1/0219 174/266 |
| 2012/0000701 A1 | 1/2012 | Chan et al. |
| 2012/0182082 A1* | 7/2012 | Lin ....................... H01L 23/642 427/97.1 |
| 2014/0196941 A1 | 7/2014 | Hidaka et al. |
| 2016/0358866 A1* | 12/2016 | Zu ........................ G06F 30/367 |
| 2017/0006709 A1* | 1/2017 | Chen .................... G06F 30/392 |
| 2018/0096735 A1* | 4/2018 | Pappu .................... H01L 25/18 |
| 2019/0116668 A1* | 4/2019 | Lizalde Moreno .... H05K 1/117 |
| 2020/0053880 A1 | 2/2020 | Twarog et al. |
| 2022/0132663 A1 | 4/2022 | Dsilva et al. |

OTHER PUBLICATIONS

"U.S. Appl. No. 17/078,471, Corrected Notice of Allowability mailed Jan. 18, 2022", 2 pgs.
"U.S. Appl. No. 17/078,471, Notice of Allowance mailed Jan. 7, 2022", 15 pgs.
"U.S. Appl. No. 17/078,471, Response filed Oct. 21, 2021 to Restriction Requirement mailed Aug. 31, 2021", 7 pgs.
"U.S. Appl. No. 17/078,471, Restriction Requirement mailed Aug. 31, 2021", 9 pgs.
"Demystifying vias in High-Speed PCB Design", Keysight Technologies Keysight HSD Seminar Mastering SI & PI Design, (2017), 30 pgs.
"International Application Serial No. PCT/US2021/051948, International Search Report mailed Dec. 27, 2021", 2 pgs.
"International Application Serial No. PCT/US2021/051948, Written Opinion mailed Dec. 27, 2021", 6 pgs.
U.S. Appl. No. 17/078,471, filed Oct. 23, 2020, Capacitive Compensation for Vertical Interconnect Accesses.
"European Application Serial No. 21883507.2, Response to Communication pursuant to Rules 161(1) and 162 EPC filed Nov. 10, 2023".
"International Application Serial No. PCT/US2021/051948, International Preliminary Report on Patentability mailed May 4, 2023", 8 pgs.
"European Application Serial No. 21883507.2, Extended European Search Report mailed Aug. 27, 2024", 10 pgs.
Chin, T. K, "Differential Pairs: Four Things You Need to Know about Vias", [Online]. Retrieved from the Internet: <URL: https://www.ti.com/lit/ta/ssztcm4/ssztcm4.pdf>, (Jun. 30, 2015), 1-6.

* cited by examiner

CAPACITIVE COMPENSATION FOR VERTICAL INTERCONNECT ACCESSES

PRIORITY APPLICATIONS

This application is a continuation of U.S. patent application Ser. No. 17/078,471, filed Oct. 23, 2020, the content of which is incorporated herein by reference in its entirety.

BACKGROUND

Multi-layer circuits use vertical interconnect accesses (VIAs) to communicate electrical signals between layers. A VIA typically comprises a conductive barrel that connects two layers and passes through any intervening layers. After the layers of the multi-layer circuit are printed (e.g., by etching), holes are drilled through the layers and the conductive barrel is placed in the hole. During printing, conductive traces connect to the location that the barrel will be placed on layers connecting to the VIA. On other layers, a cylindrical clearing around the vias is created which provides insulation between the VIA and the metal on that layer. The conductive region surrounding a VIA on a connected layer is referred to as a pad; the non-conductive region surrounding a VIA on a layer, whether connected or unconnected, is referred to as an antipad. The holes may be plated with a conductive material (e.g., copper) that electrically connects the pads.

Discontinuities in electrical connections, including discontinuities resulting from VIAs, result in signal loss when the operating frequency increases. Circuit designers compensate for this increased impedance by reducing the operating frequency or increasing the operating voltage, either of which increases the power consumption per operation of the resulting circuit.

A differential VIA comprises two conductive barrels in separate holes. The signal carried on the differential VIA is determined by comparing the voltages of the two conductive barrels. By contrast, a standard VIA uses a single conductive barrel and the signal carried on the standard VIA is determined by comparing the voltage of the conductive barrel with ground.

BRIEF DESCRIPTION OF THE DRAWINGS

Some embodiments of the disclosed technology are illustrated by way of example and not limitation in the figures of the accompanying drawings.

DETAILED DESCRIPTION

Example methods, systems and circuits for fabricating a multi-layer circuit including capacitive compensation for a differential VIA will now be described. In the following description, numerous examples having example-specific details are set forth to provide an understanding of example embodiments. It will be evident, however, to one of ordinary skill in the art that these examples may be practiced without these example-specific details, and/or with different combinations of the details than are given here. Thus, specific embodiments are given for the purpose of simplified explanation, and not limitation.

By modifying the physical structures used to implement a circuit, the impedance of the circuit is altered without affecting the logic implemented by the circuit. Multiple designs may be simulated to determine impedance profiles of each design, allowing a circuit designer to select a design based on the impedance profiles. The impedance profile indicates the impedance of the circuit as a function of frequency, a function of time after a step function is applied, or both.

One feature that can be modified is the structure surrounding the barrels of a differential VIA on layers that are not connected to the differential VIA. Specifically, one antipad can be used that surrounds both barrels or two antipads can be used, with one antipad for each barrel. Additionally, the size of the antipad or antipads can be modified. These modifications affect the impedance of the differential VIA.

Additionally, a conductive region may be placed that connects to the VIA barrel even though the circuit on the layer does not connect to the VIA. This unused pad, surrounded by a non-conductive region, also affects the impedance of the differential VIA.

Inter-layer effects may also exist. For example, fabricating two unused pads on adjacent layers may create a pseudo-capacitor between the pads, which impacts the impedance of the VIA. Since the thickness of layers in a multi-layer circuit may vary and the distance between capacitor plates impacts a capacitor's strength, the layers of the multi-layer circuit on which to create unused pads may be selected based on the thickness of the dielectric layer between the two circuit layers.

By using these improved fabrication techniques to fabricate multi-layer circuits in which VIAs have improved impedance profiles, circuit efficiency is improved. For example, the resulting circuit may operate at a reduced voltage or higher frequency than a similar circuit fabricated using traditional VIA designs. As another example, a circuit may be designed that uses more VIAs without negatively impacting performance, allowing a multi-layer circuit to be fabricated that takes greater advantage of the three-dimensional structure for improved efficiency.

Figure 1:
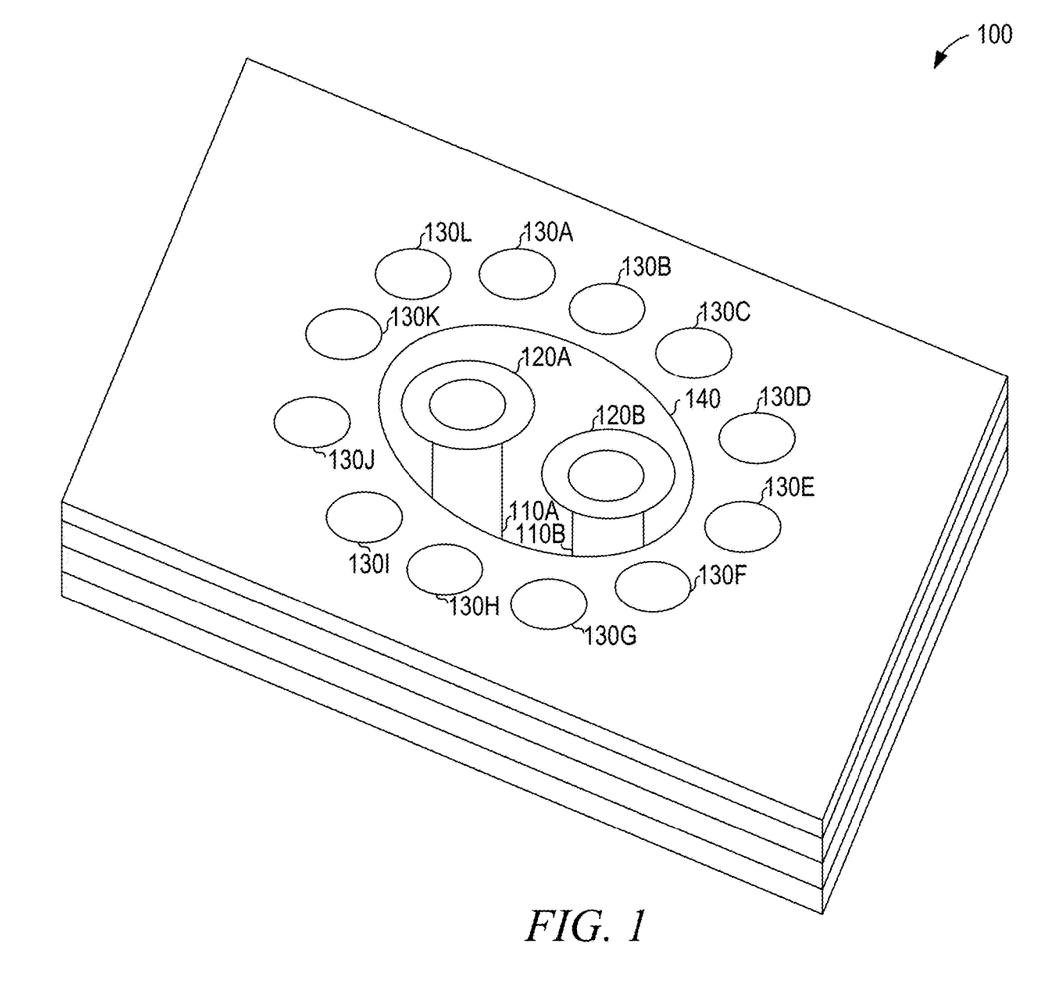
FIG. 1 is a diagrammatic isometric view of a multi-layer circuit including a differential VIA and ground connections, according to some example embodiments.

FIG. 1 is a diagrammatic isometric view of a multi-layer circuit 100 including a differential VIA and ground connections, according to some example embodiments. The differential VIA comprises VIA barrels 110A and 110B and pads 120A and 120B, placed in a hole 140. The ground connections 130A, 130B, 130C, 130D, 130E, 130F, 130G, 130H, 130I, 130J, 130K, and 130L surround the hole 140, allowing current received through the differential VIA to be efficiently returned to ground. The multi-layer circuit may be a silicon die package, a printed circuit board (PCB), or another multi-layer circuit.

Circuit traces on the top layer of the multi-layer circuit connect to the pads 120A and 120B. The interfaces between the differential VIA and the other layers are not shown in FIG. 1, but at least one other layer must connect to the differential VIA to allow for inter-layer communication using the differential VIA.

Figure 2:
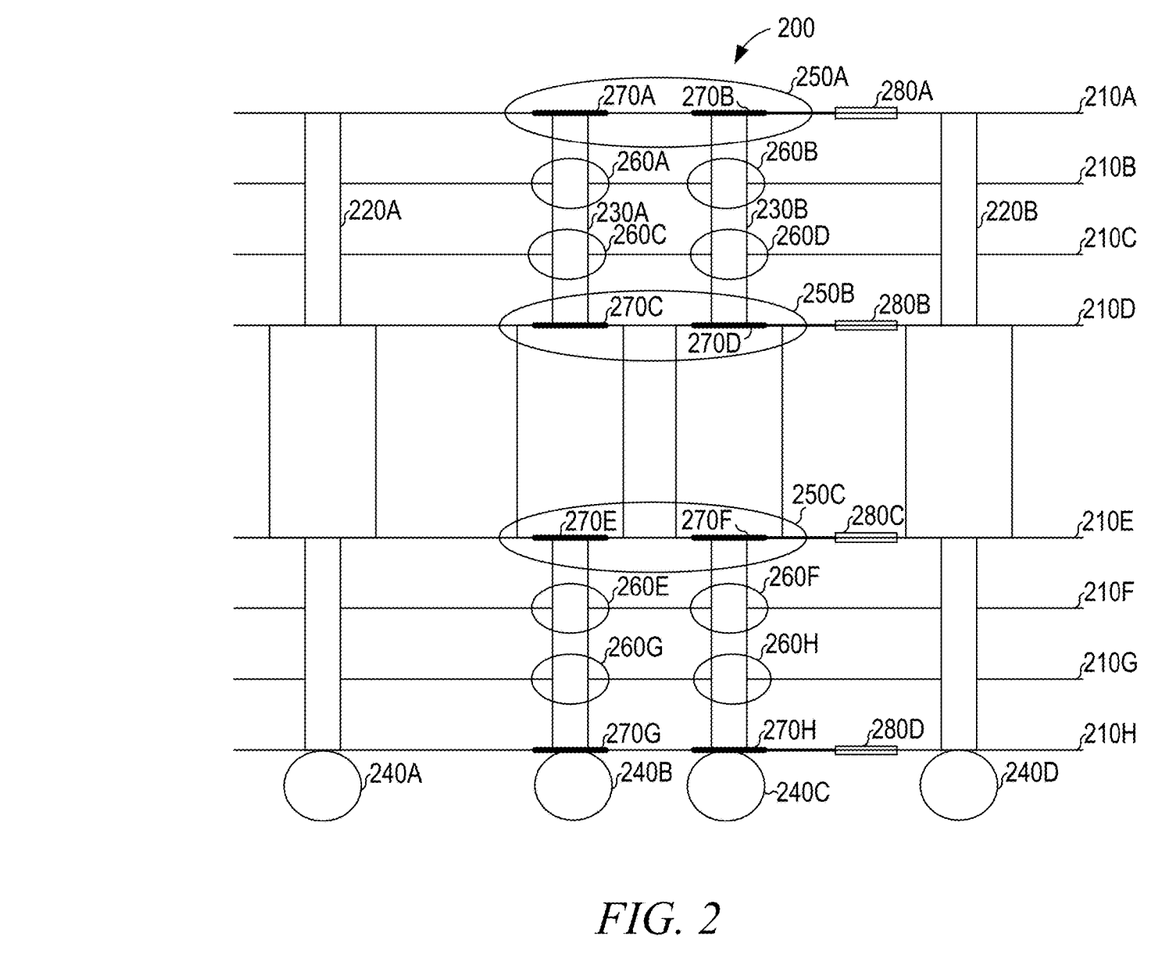
FIG. 2 is a diagrammatic cross-section view of a first design of a multi-layer circuit including a differential VIA and ground connections, according to some example embodiments.

FIG. 2 is a diagrammatic cross-section view of a multi-layer circuit 200 including a differential VIA and ground connections 220A and 220B, according to some example embodiments. The multi-layer circuit 200 comprises circuit layers 210A, 210B, 210C, 210D, 210E, 210F, 210G, and 210H. The differential VIA includes VIA barrels 230A and 230B, antipads 250A, 250B, 250C, 260A, 260B, 260C, 260D, 260E, 260F, 260G, and 260H, and pads 270A, 270B, 270C, 270D, 270E, 270F, 270G, and 270H. External connections to the multi-layer circuit 200 are provided by balls 240A, 240B, 240C, and 240D. For example, solder may be used to connect the balls 240A-240D of the multi-layer circuit 200 to a socket on a circuit board.

The pads 270A-270H connect the conductive VIA barrels 230A-230B to circuit components 280A, 280B, 280C, and 280D on the layers 210A, 210D, 210E, and 210H. The pads 270A-270H may be circular or ovoid in shape, among other options. The presence, absence, size, and shape of the pad on each layer impacts the impedance of the differential VIA. Additionally, the distance between the VIA barrels 230A and 230B, the distance between the VIA barrels 230A-230B and the ground connections 220A-220B, or both may affect the impedance of the differential VIA. For example, reducing the distance between the two VIA barrels 230A and 230B may increase the capacitance of the differential VIA, noting that at least a minimum separation is required to avoid direct current flow between the two conductors.

In the example of FIG. 2, a single antipad is used on each layer with pads for the differential VIA, and two antipads are used on each layer lacking pads for the differential VIA. Thus, layer 210C, which has separate non-conductive regions (in the form of antipads 260C and 260D) surrounding each of the conductive elements of the differential VIA (in the form of VIA barrels 230A and 230B), lacks a VIA pad.

The antipads 250A-260A (e.g., non-conductive voids) separate the conductive VIA barrels 230A-230B from unconnected circuit components. For clarity, the antipads 250A-260A are drawn in an isometric view, rather than in profile since, in the true profile view, they would be nearly invisible. On layers 210A, 210D, and 210E, a single antipad surrounds both VIA barrels 230A and 230B. On layers 210B, 210C, 210F, and 210G, separate antipads surround each of the VIA barrels 230A and 230B. The selection of whether to use a single antipad or multiple antipads on a layer impacts the impedance of the differential VIA. Additionally, the size of each antipad impacts the impedance of the differential VIA.

A dielectric material separates each circuit layer. The thickness of the dielectric material is not necessarily the same between each pair of circuit layers. In the example shown in FIG. 2, the thickness of the dielectric material between the circuit layers 210D and 210E is greater than the thickness of the dielectric material between other pairs of adjacent circuit layers. In some example embodiments, every fourth dielectric material layer is thicker to provide greater structural stability to the finished multi-layer circuit.

The balls 240A-240D provide for external connections to the fabricated circuit. For example, the fabricated circuit may be a flip-chip ball grid array (FCBGA) chip and the balls 240A-240D of the FCBGA may be connected to a PCB using solder. An FCBGA chip may comprise a printed silicon die connected to a substrate that routes pin signals from the die to ball connections. The substrate acts as an adapter between the custom silicon die and a PCB that expects a predefined ball interface. Using different substrates, the same silicon die design can be used to create different PCBGAs for use with different PCBs. The substrate may be fabricated using a less-expensive process than the silicon die, resulting in efficiency gains over simply fabricating different monolithic chips.

Figure 3:
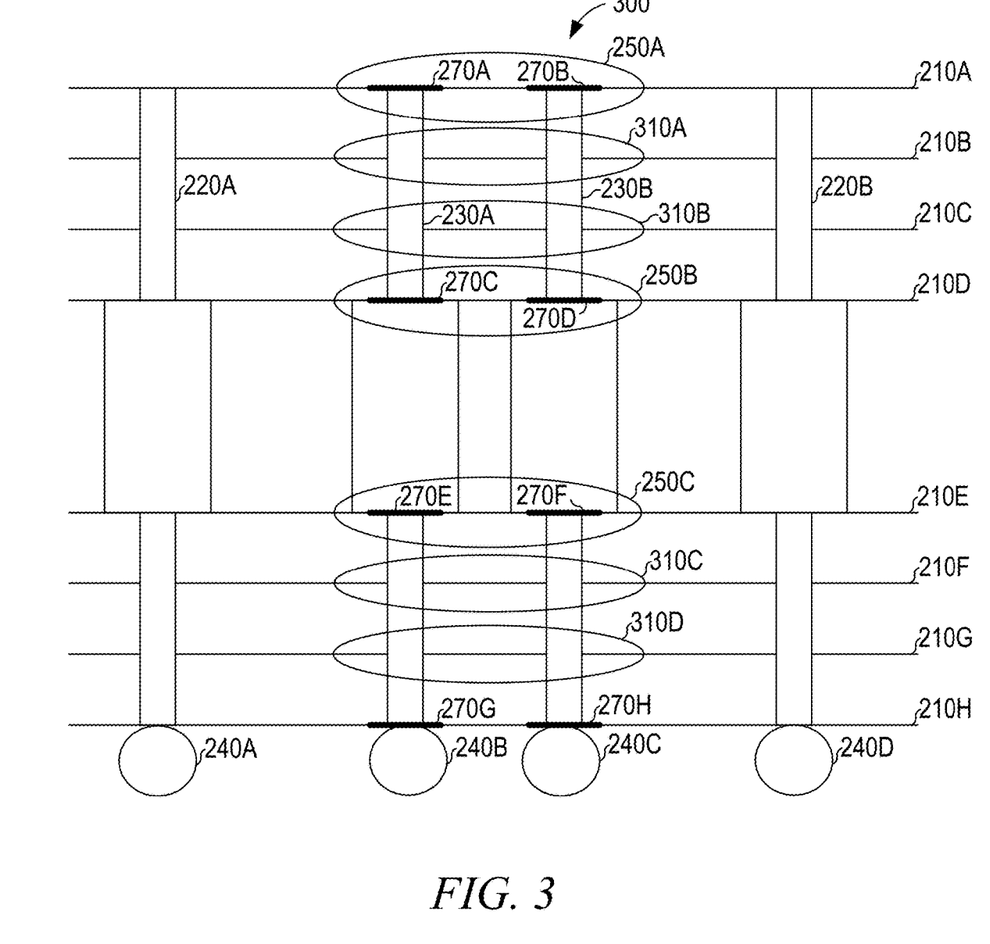
FIG. 3 is a diagrammatic cross-section view of a second design of a multi-layer circuit including a differential VIA and ground connections, according to some example embodiments.

FIG. 3 is a diagrammatic cross-section view of a second design of a multi-layer circuit 300 including a differential VIA and ground connections, according to some example embodiments. The multi-layer circuit 300 comprises circuit layers 210A, 210B, 210C, 210D, 210E, 210F, 210G, and 210H. The differential VIA includes VIA barrels 230A and 230B, antipads 250A, 250B, 250C, 310A, 310B, 310C, and 310D, and pads 270A, 270B, 270C, 270D, 270E, 270F, 270G, and 270H. External connections to the multi-layer circuit 300 are provided by balls 240A, 240B, 240C, and 240D.

The multi-layer circuit 300 differs from the multi-layer circuit 200 only in the replacement of antipads 260A-260H with antipads 310A-310D. In FIG. 2, each of the layers 210B, 210C, 210F, and 210G uses a separate antipad for each of the two VIA barrels 230A and 230B. In FIG. 3, these layers use a single larger antipad. The use of a different antipad design affects the impedance of the multi-layer circuits 200 and 300. Measuring the impedance of the differential VIA for each design (either in simulation or on an actual device) allows the circuit designer to select the circuit design that reduces signal reflections due to impedance discontinuities.

Figure 4:
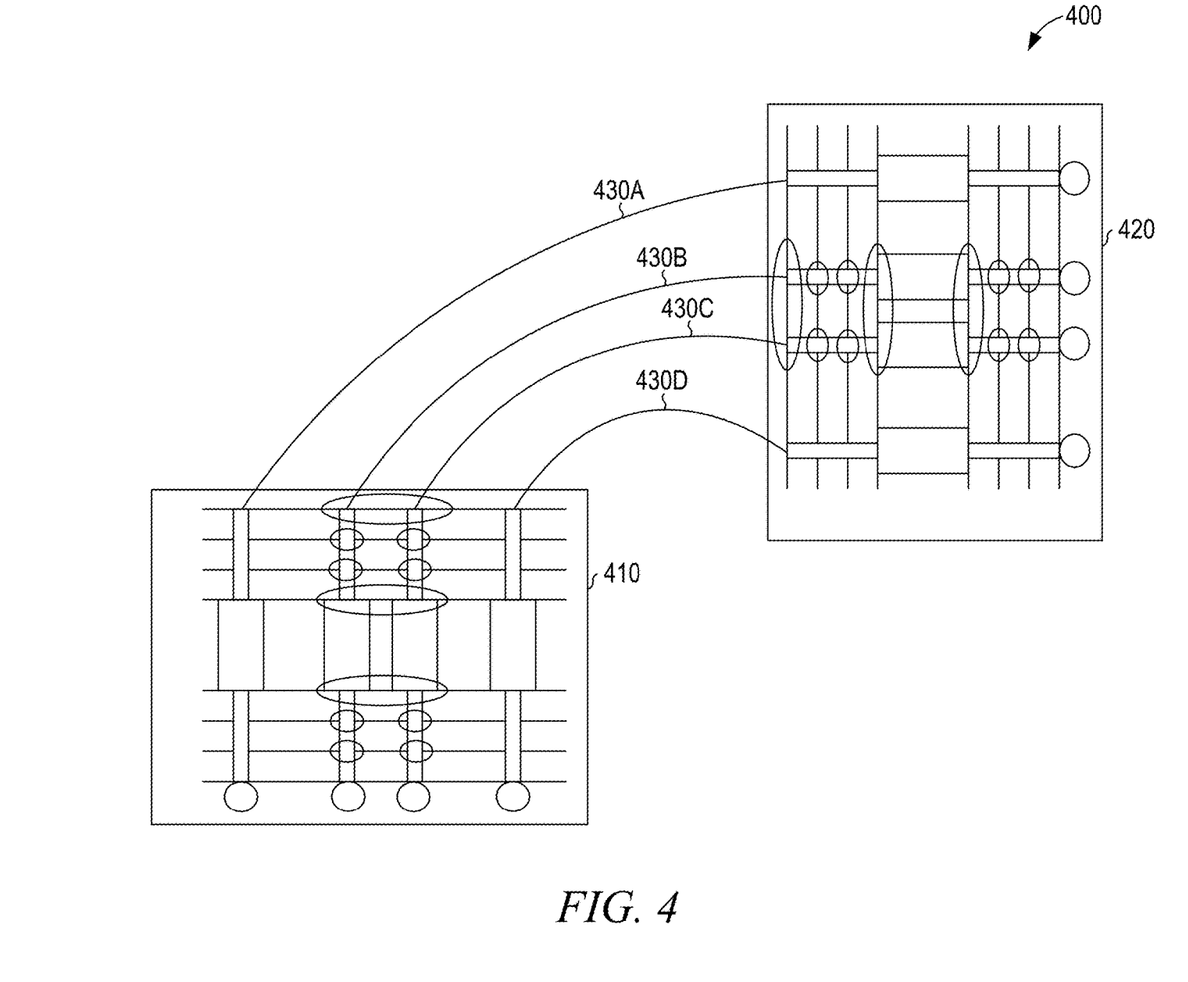
FIG. 4 is a diagrammatic cross-section view of two connected multi-layer circuits, each including a differential VIA and ground connections, according to some example embodiments.

FIG. 4 is a diagrammatic cross-section view 400 of two connected multi-layer circuits 410 and 420, each including a differential VIA and ground connections, according to some example embodiments. The connections 430A, 430B, 430C, and 430D between the multi-layer circuits 410 and 420 introduce additional discontinuities that affect impedance. Thus, the desired impedance of VIAs in each of the circuits 410 and 420 may be different when the circuit is intended to be used in the configuration of FIG. 4 than when the circuit is intended be used in a stand-alone configuration. Accordingly, simulations of different VIA options may be run in an environment that simulates the presence of other circuits to facilitate selection of the design to be fabricated.

As an example, two FCBGA chips may be mounted on a PCB and communicate with each other. A signal from the first chip originates from a circuit on its silicon die, then enters the package of the first chip where it is routed to the external balls of the first chip. The package itself consists of multiple layers of copper planes insulated from each other with dielectric materials. The middle layer (also called the core layer, shown between circuit layers 210D and 210E in FIG. 2) has the thickest dielectric material and provides mechanical stability to the package.

The first chip's balls are connected (either soldered or through an intermediate socket) to traces on the PCB, which allows the signal to physically travel to the second chip, where it again connects to the second chip's external balls via solder or a socket, and then traverses the second chip's package layers and reaches the silicon die inside the second chip.

When a signal is being routed on a package or a PCB, it will electrically traverse between vertical layers. In a package, for example, the silicon die may be mounted on one side of the substrate via controlled collapse chip connection (C4) bumps. VIA structures provide the vertical connection between the silicon die on one side of the substrate and the balls on the opposite side. One physical implementation is a plated through hole (PTH) VIA which can be formed with a drill or laser that traverses the entire layer stack, with the resulting hole filled in with a conductive material.

An impedance discontinuity on the conductive path between the silicon die and the external balls leads to reflections and resonances, which hampers the transmitted signal in reaching the receiver. It is vital to have as smooth of an impedance profile as possible in approaching higher data rates (25 Gbps+) because any discontinuities can reduce the channel reach at those data rates. A smooth impedance profile translates to a resonance free insertion loss profile and thus helps in the overall interconnect performance from a reflection and loss perspective.

For horizontal signal routing on a single layer, also known as a trace, the impedance may be controlled by varying the signal trace width and signal-to-signal and signal-to-ground spacing. However, the vertical VIA section introduces impedance discontinuities that can significantly affect signal integrity in high speed designs if the impedance transition from trace to VIA is too abrupt.

Figure 5:
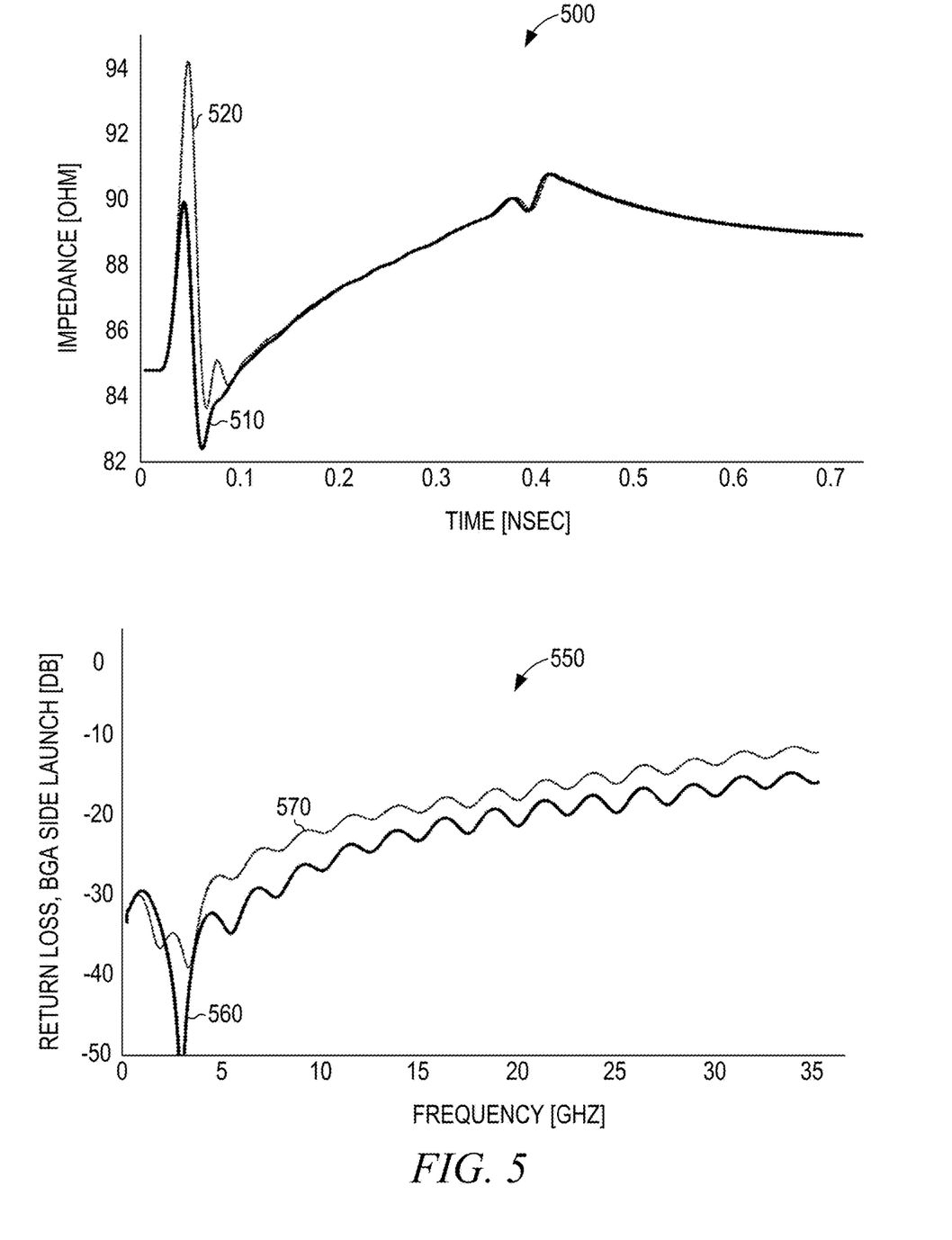
FIG. 5 shows differences in VIA impedance for two different designs of a multi-layer circuit, according to some example embodiments.

FIG. 5 show differences in VIA impedance for two different designs of a multi-layer circuit, according to some example embodiments. The graph 500 shows the impedance, measured in Ohms, for each design as a function of time measured after the application of a step input. The graph 550 shows the return loss of a signal provided to the ball grid array (BGA) side of an FCBGA chip, measured in decibels, for each design as a function of frequency. The curves 510 and 560 represent the first design in the graphs 500 and 550 respectively. The curves 520 and 570 represent the second design in the graphs 500 and 550 respectively. The graphs 500 and 550 may be generated using software simulation of the two designs or by measuring the actual response of fabricated devices (e.g., using an oscilloscope).

The graph 500 shows that both designs have very similar impedances, of about 89 Ohms, for the time period after 0.1 nanoseconds. However, the peak impedance of the first design, at about 0.05 nanoseconds, is about 90 Ohms while the peak impedance of the second design, at about the same time, is about 94 Ohms. Thus, the deviation from the steady-state impedance is reduced for the first circuit design by comparison with the second.

The graph 550 shows that both designs have similar signal return losses at low frequencies, below about 2 GHz. However, the first design has a loss spike at around 3 GHz, possibly due to a resonance. Additionally, at all frequencies above about 5 GHz, the second design enjoys about 5 dB less loss by comparison with the first design.

By comparison of the curves 510 and 520 of the graph 500 and comparison of the curves 560 and 570 of the graph 550, a circuit designer is enabled to select a circuit having lower impedance, less impedance variation over time, lower return loss, or any suitable combination thereof. In some example embodiments, circuit design software automatically selects a circuit design based on one or more of these criteria.

Figure 6:
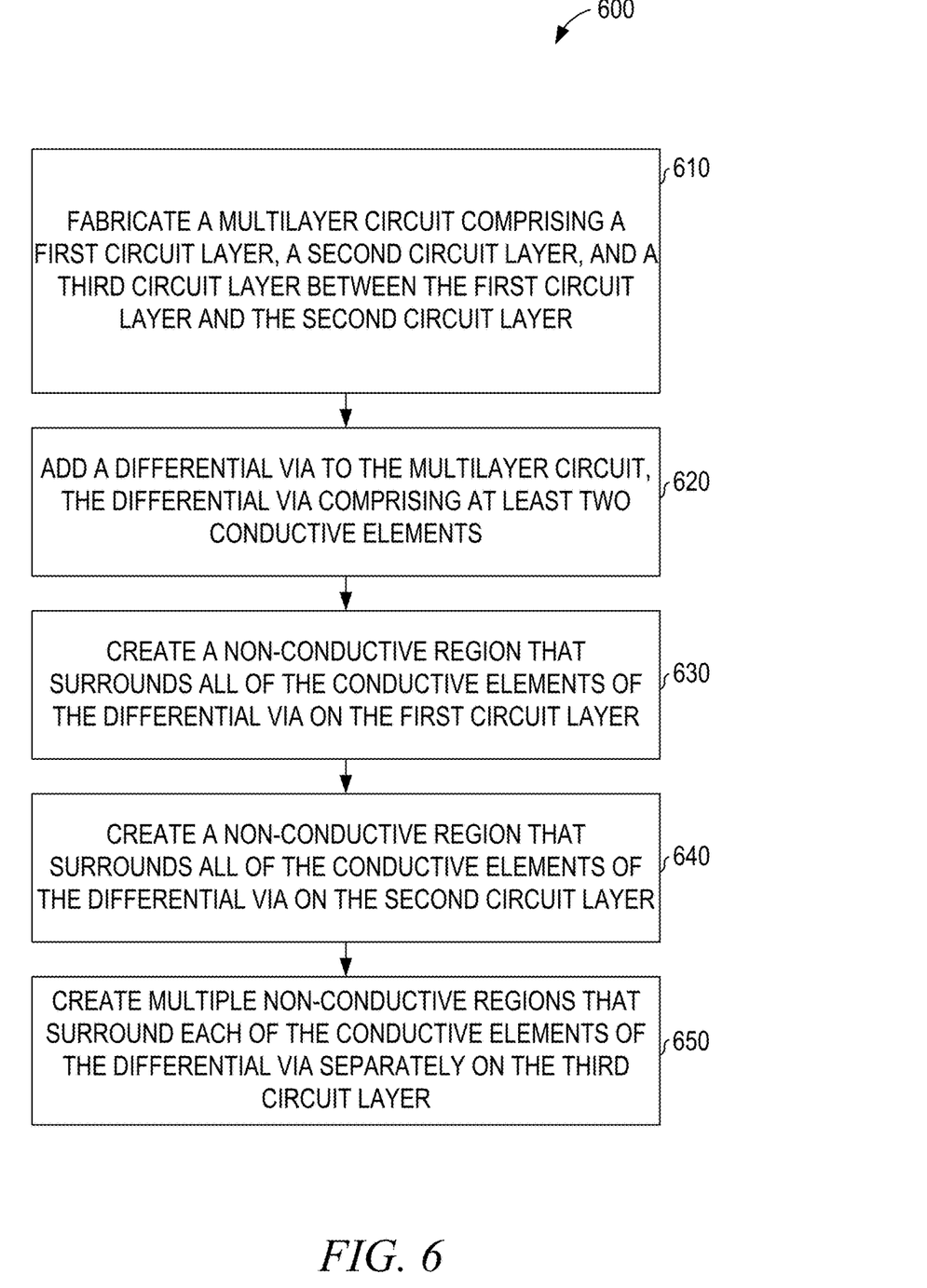
FIG. 6 is a flowchart of a method of fabricating a multi-layer circuit including capacitive compensation for a differential VIA, according to some example embodiments.

FIG. 6 is a flowchart of a method 600 of fabricating a multi-layer circuit including capacitive compensation for a differential VIA, according to some example embodiments. The method 600 includes operations 610, 620, 630, 640, and 650. By way of example and not limitation, the method 600 is described as being performed by components of the system 1000 of FIG. 10, with reference to the structures of FIGS. 1-4.

In operation 610, the fabrication module 1070 fabricates (e.g., by controlling photolithographic and chemical processing steps acting on one or more silicon wafers) a multi-layer circuit comprising a first circuit layer, a second circuit layer, and a third circuit layer between the first circuit layer and the second circuit layer. For example, FIG. 1 shows a multi-layer circuit with four circuit layers and FIG. 2 shows a multi-layer circuit with eight circuit layers.

The fabrication module 1070, in operation 620, adds a differential VIA to the multi-layer circuit, the differential VIA comprising at least two conductive elements. For example, a computer numerical control (CNC) device may be used to precisely drill one or more holes in the multi-layer circuit and to add two or more VIA barrels in the one or more holes.

In operation 630, the fabrication module 1070 creates a non-conductive region that surrounds all of the conductive elements of the differential VIA on the first circuit layer. For example, in FIG. 2, the antipad 250A surrounds both VIA barrels on layer 210A. The step of creating the non-conductive region on the first circuit layer may be performed as part of the fabrication of the multi-layer circuit in operation 610 and before the adding of the differential VIA to the multi-layer circuit in operation 620.

The fabrication module 1070 also creates, in operation 640, a non-conductive region that surrounds all of the conductive elements of the differential VIA on the second circuit layer. Continuing with the example of FIG. 2, the antipad 250B surrounds both VIA barrels on layer 210D and the antipad 250C surrounds both VIA barrels on layer 210E. Thus, either of the layers 210D and 210E may be the second circuit layer of operations 610 and 640. As noted with respect to operation 630, the step of creating the non-conductive region on the second circuit layer may be performed as part of the fabrication of the multi-layer circuit in operation 610 and before the adding of the differential VIA to the multi-layer circuit in operation 620.

In operation 650, the fabrication module 1070 creates multiple non-conductive regions that surround each of the conductive elements of the differential VIA separately on the third circuit layer. In FIG. 2, layers 210B and 210C lie between the first and second circuit layers, matching the description of the third circuit layer of operation 610. On layer 210B, separate antipads 260A and 260E are created. On layer 210C, separate antipads 260B and 260F are created. The step of creating the non-conductive region on the third circuit layer may be performed as part of the fabrication of the multi-layer circuit in operation 610 and before the adding of the differential VIA to the multi-layer circuit in operation 620.

Additional intervening layers may be fabricated, with varying configurations of pads and antipads. For example, when layer 210B is considered the third circuit layer as discussed above, layer 210C may be considered to be a fourth circuit layer. In the example of FIG. 2, layer 210C is fabricated with no pads and two separate antipads. In other example embodiments, layer 210C may be fabricated with pads and separate antipads, with pads and a single antipad, or without pads and a single antipad.

Thus, as a result of the method 600, a multi-layer circuit is fabricated that has different non-conductive regions related to differential VIA barrels on different layers. By comparison to existing fabrication methods that surround differential VIA barrels with a single non-conductive region on all layers, greater control of the impedance of the differential VIA is provided to the circuit designer. Using this greater control, circuits may be designed that operate at lower voltages, higher frequencies, or both.

Figure 7:
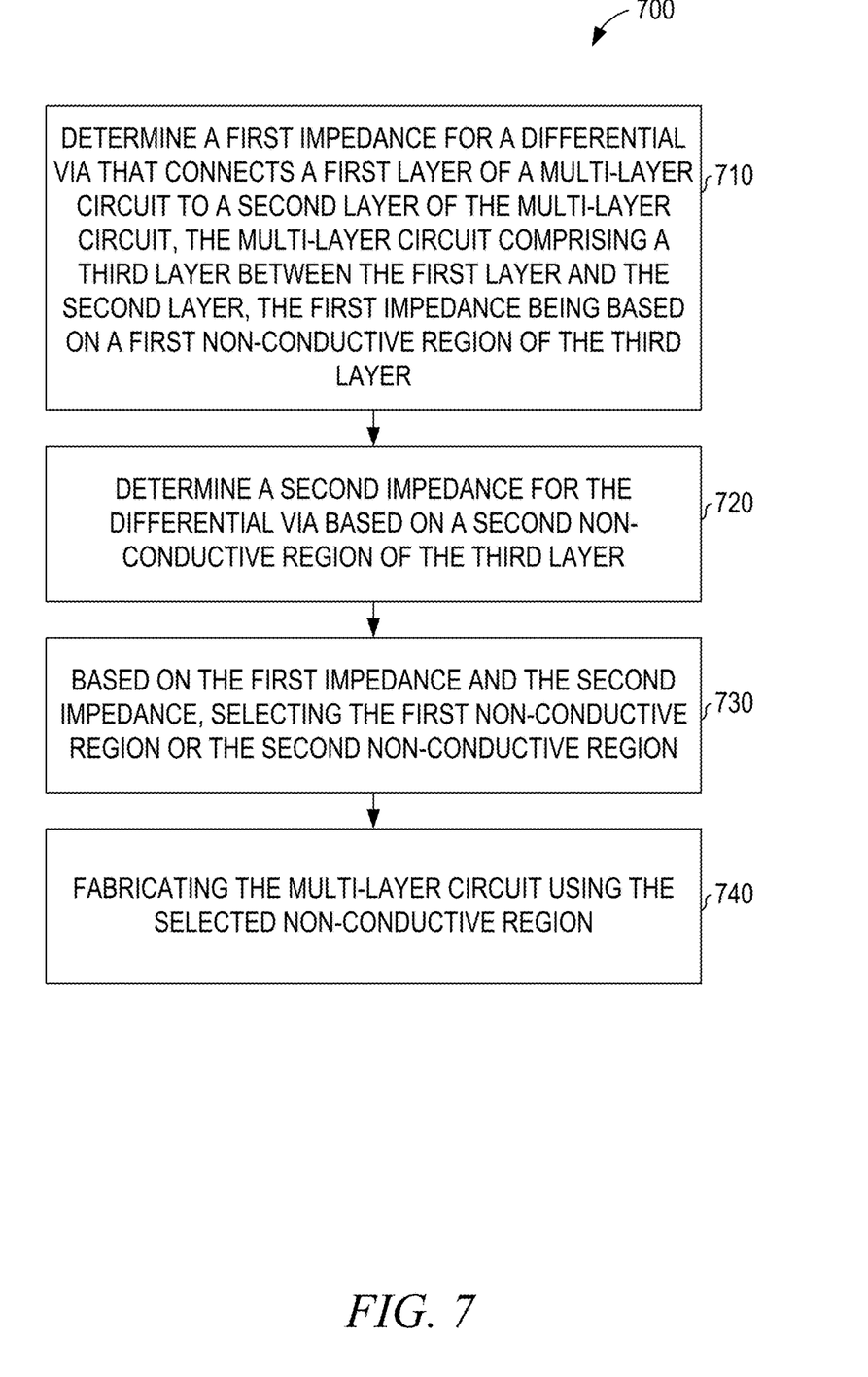
FIG. 7 is a flowchart of a method of fabricating a multi-layer circuit including capacitive compensation for a differential VIA, according to some example embodiments.

FIG. 7 is a flowchart of a method 700 of fabricating a multi-layer circuit including capacitive compensation for a differential VIA, according to some example embodiments. The method 700 includes operations 710, 720, 730, and 740. By way of example and not limitation, the method 700 is described as being performed by components of the system 1000 of FIG. 10, with reference to the structures of FIGS. 1-4.

In operation 710, the impedance module 1060 determines a first impedance for a differential VIA that connects a first layer of a multi-layer circuit (e.g., layer 210A of FIG. 2) to a second layer of the multi-layer circuit (e.g., layer 210D), the multi-layer circuit comprising a third layer (e.g., layer 210B) between the first layer and the second layer, the first impedance being based on a first non-conductive region of the third layer. For example, using a first circuit design for the multi-layer circuit of FIG. 2, a single non-conductive region surrounding both VIA barrels may be placed on each layer. In operation 710, an impedance for the differential VIA is determined for the first circuit design. In some example embodiments, the determined impedance is based on physical measurements on a device. In other example embodiments, the determined impedance is based on device simulations.

The impedance module 1060, in operation 720, determines a second impedance for the differential VIA based on a second non-conductive region of the third layer. Continuing with this example, a second circuit design for the multi-layer circuit of FIG. 2 may be as depicted in the figure, with separate non-conductive regions surrounding each VIA barrel on layer 210B. Due to the separation of the two non-conductive regions, impedance of the differential VIA is changed. In some example embodiments, the determined impedance is based on physical measurements on a device. In other example embodiments, the determined impedance is based on device simulations.

In some example embodiments, parameters of the second circuit design are determined based on the first impedance determined for the first circuit design. For example, if the capacitance of the first impedance is too high, the size of one or more VIA pads may be reduced, unused pads may be removed, the size of one or more antipads may be increased, or any suitable combination thereof. As another example, if the capacitance of the first impedance is too low, the size of one or more VIA pads may be increased, unused pads may be added, the size of one or more antipads may be decreased, or any suitable combination thereof. Here, "too high" and "too low" are relative to the desired characteristics of the circuit design specified by the circuit designer or automatically generated by a design tool that attempts to match the impedance of the VIA with the impedance of the multi-layer circuit without the VIA.

Based on the first impedance and the second impedance, the VIA design module 1065 selects the first non-conductive region or the second non-conductive region (operation 730). For example, if the second impedance better matches the impedance of the rest of the multi-layer circuit, the second circuit design with the second non-conductive region may be selected. In some example embodiments, the VIA design having the greatest or least capacitance is selected.

In operation 740, the fabrication module 1070 fabricates the multi-layer circuit using the selected non-conductive region. Thus, by use of the method 700, multiple options for the differential VIA are considered and the design with better impedance characteristics is fabricated.

Figure 8:
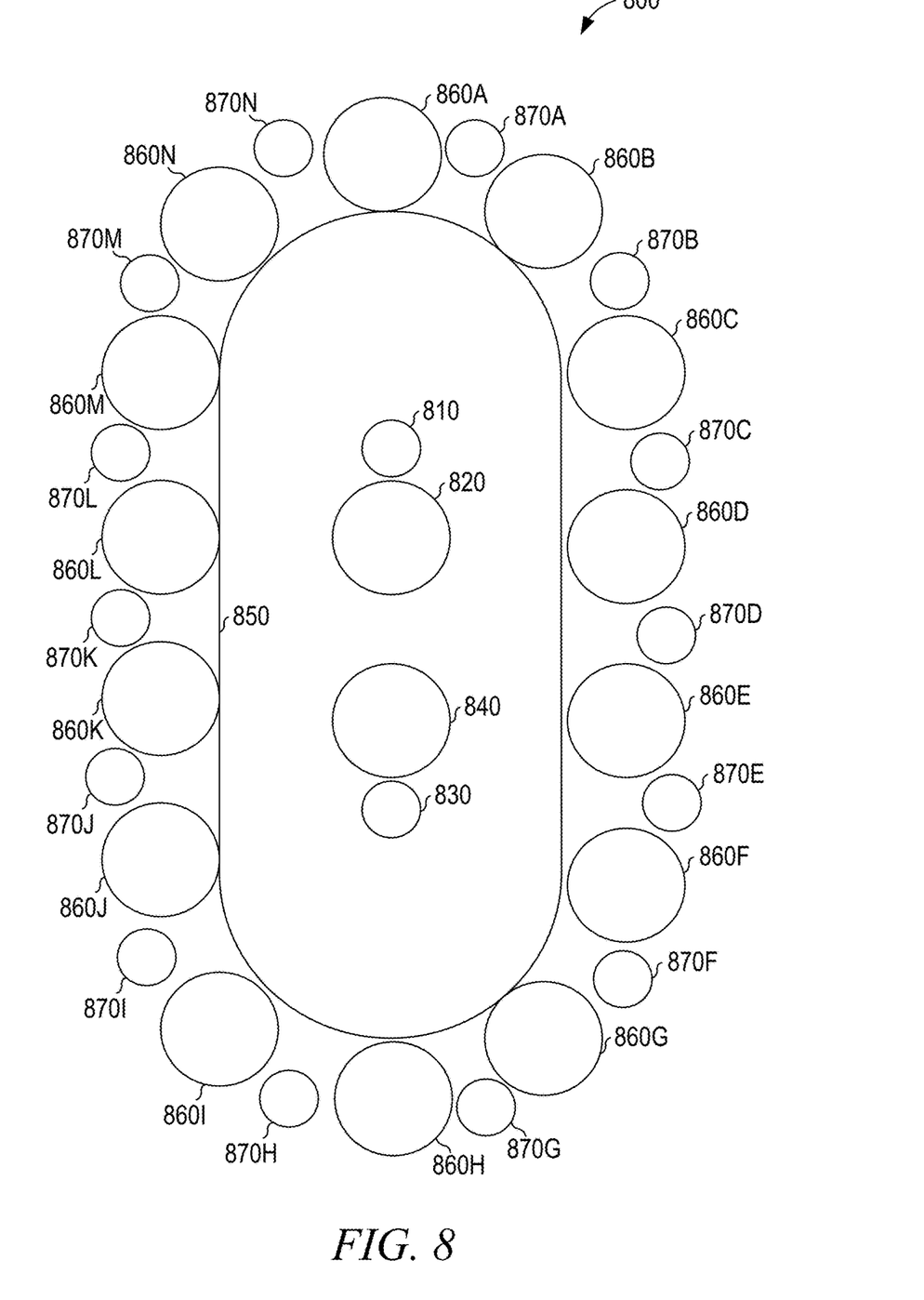
FIG. 8 is a circuit design diagram of a layer of a circuit having a single antipad for a differential VIA, according to some example embodiments.

FIG. 8 is a circuit design diagram of a layer 800 of a circuit having a single antipad for a differential VIA, according to some example embodiments. The design for the layer 800 includes conductive elements 810, 820, 830, and 840 of a differential VIA. The conductive elements 810-840 are surrounded by a single non-conductive antipad 850. Around the antipad 850 are arranged ground conductors 860A, 806B, 860C, 860D, 860E, 860F, 860G, 860H, 860I, 860J, 860K, 860L, 860M, 860N, 870A, 870B, 870C, 870D, 870E, 870F, 870G, 870H, 870I, 870J, 870K, 870L, 870M, and 870N.

The conductive elements 810-840 are arranged in pairs, with one pair of elements 810-820 carrying the positive portion of the differential signal and the other pair of elements 830-840 carrying the negative portion of the differential signal. Ample provision of the ground conductors 860A-870N allows for rapid dissipation of current carried to the layer 800 by the differential VIA.

Figure 9:
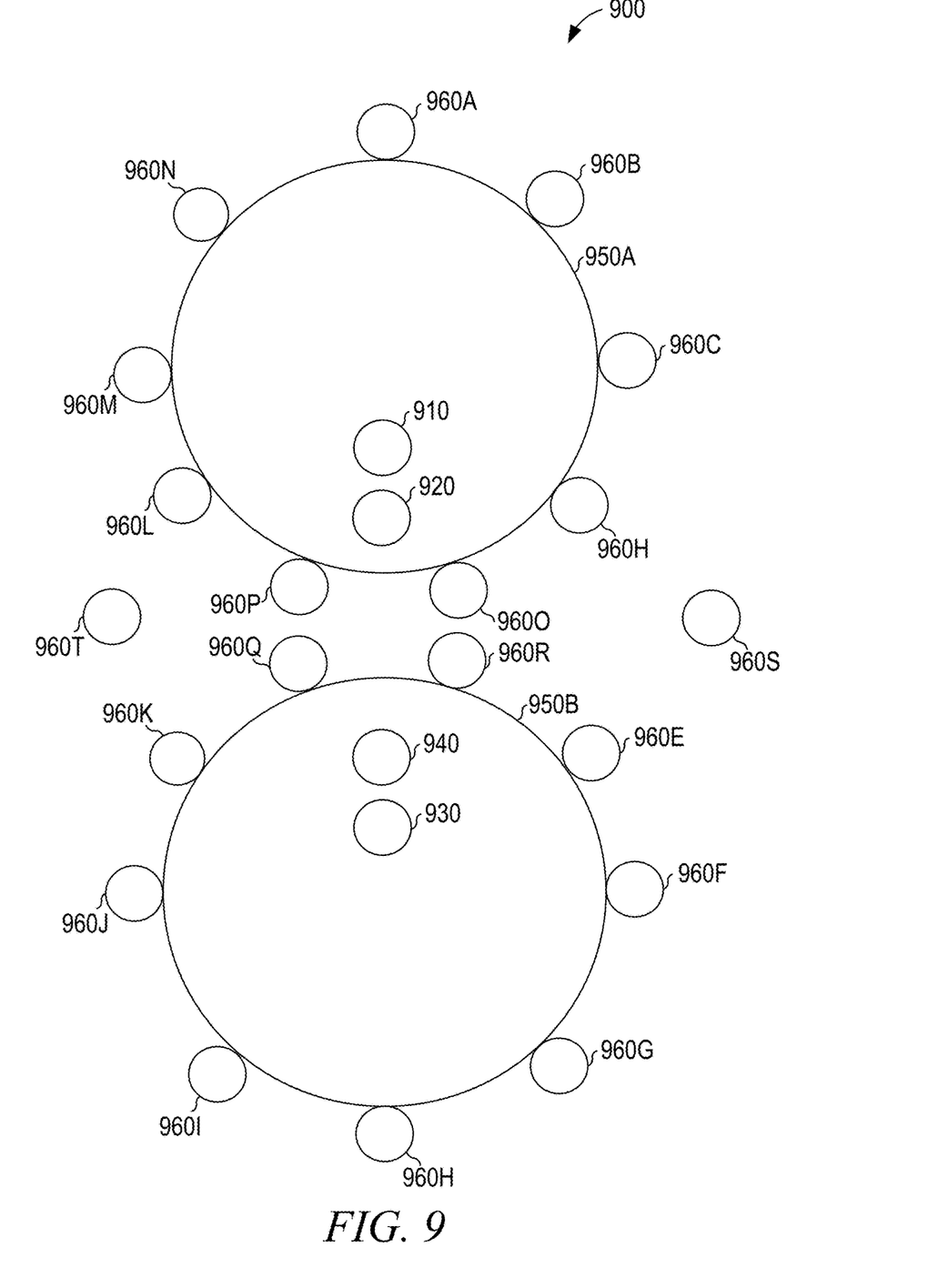
FIG. 9 is a circuit design diagram of a layer of a circuit having two antipads for a differential VIA, according to some example embodiments.

FIG. 9 is a circuit design diagram of a layer 900 of a circuit having two antipads for a differential VIA, according to some example embodiments. The design for the layer 900 includes conductive elements 910, 920, 930, and 940 of a differential VIA. The conductive elements 910-940 are divided into two pairs, with each pair surrounded by a separate non-conductive antipad 950A or 950B. Around the antipad 950A are arranged ground conductors 960A, 960B, 960C, 960H, 960L, 960M, 960N, 960O, and 960P. Around the antipad 950B are arranged ground conductors 960E, 960F, 960G, 960H, 960I, 960J, 960K, 960Q, and 960R. Also present on the layer 900 are ground conductors 960S and 960T.

The conductive elements 910-940 are arranged in pairs, with one pair of elements 910-920 carrying the positive portion of the differential signal and the other pair of elements 930-940 carrying the negative portion of the differential signal. The radius of the antipads 950A and 950B on the layer 900 is larger than the radius of the circular portions of the antipad 850 on the layer 800. The number, size, or both of the ground conductors 960A-960T on the layer 900 is reduced compared to the ground conductors 860A-870N on the layer 800.

The circuit design of the layer 900 may be used for layers that do not connect to the differential VIA and the circuit design of the layer 800 may be used for layers that do connect to the differential VIA. Adjustment of the design parameters, such as antipad radius, number of antipads, number of ground connectors, location of ground connectors, size of ground connector, or any suitable combination thereof, may allow for an improved impedance profile of the differential VIA, as shown in FIG. 5.

Figure 10:
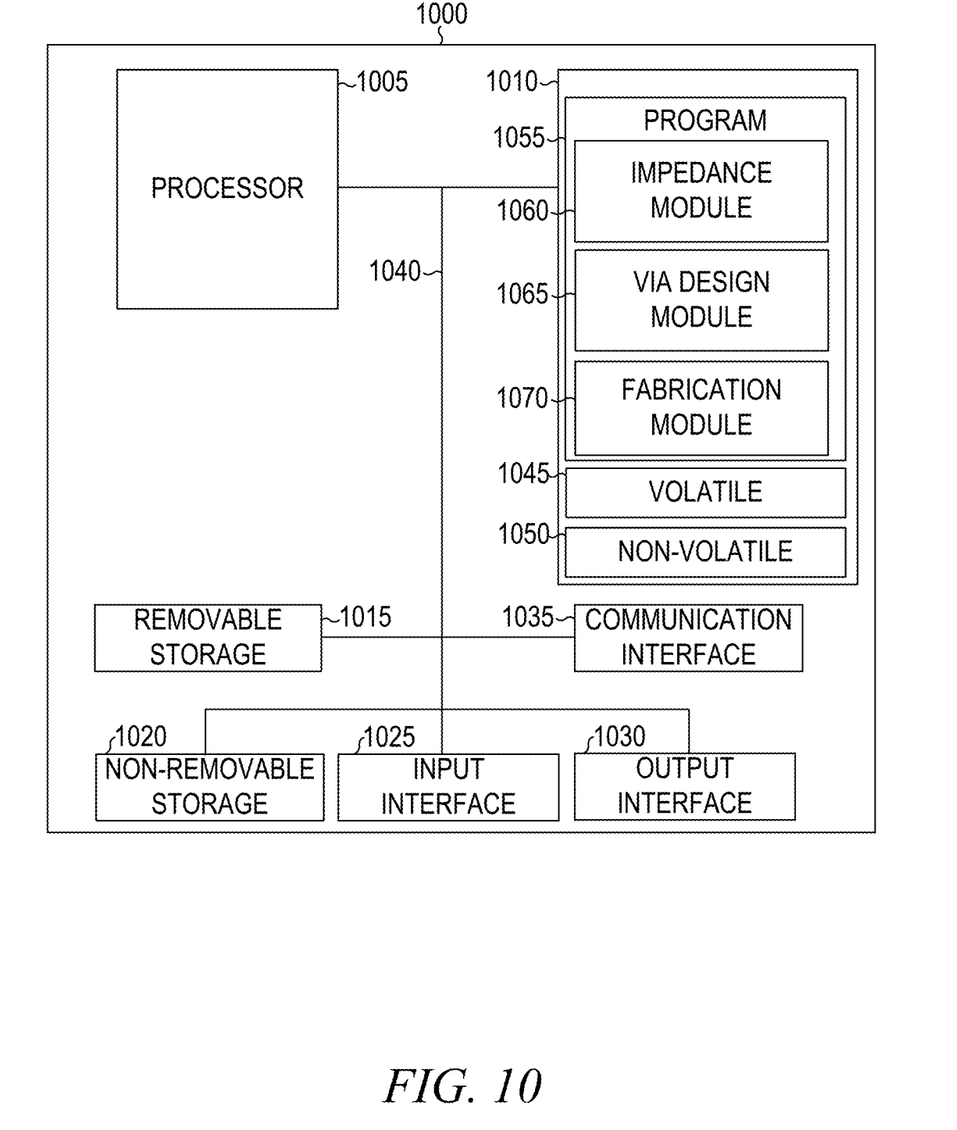
FIG. 10 is a block diagram illustrating components of a system for performing the methods described herein, according to some example embodiments.

FIG. 10 is a block diagram illustrating components of a system 1000 for performing the methods described herein, according to some example embodiments. All components need not be used in various embodiments. For example, clients, servers, autonomous systems, and cloud-based network resources may each use a different set of components, or, in the case of servers, for example, larger storage devices.

One example computing device in the form of a computer 1000 (also referred to as computing device 1000 and computer system 1000) may include a processor 1005, memory storage 1010, removable storage 1015, and non-removable storage 1020, all connected by a bus 1040. Although the example computing device is illustrated and described as the computer 1000, the computing device may be in different forms in different embodiments. For example, the computing device may instead be a smartphone, a tablet, a smartwatch, or another computing device including elements the same as or similar to those illustrated and described with regard to FIG. 10. Devices such as smartphones, tablets, and smartwatches are collectively referred to as "mobile devices." Further, although the various data storage elements are illustrated as part of the computer 1000, the storage may also or alternatively include cloud-based storage accessible via a network, such as the Internet, or server-based storage.

The memory storage 1010 may include volatile memory 1045 and non-volatile memory 1050 and may store a program 1055. The computer 1000 may include, or have access to, a computing environment that includes a variety of computer-readable media, such as the volatile memory 1045; the non-volatile memory 1050; the removable storage 1015; and the non-removable storage 1020. Computer storage includes random-access memory (RAM), read-only memory (ROM), erasable programmable read-only memory (EPROM) and electrically erasable programmable read-only memory (EEPROM), flash memory or other memory technologies, compact disc read-only memory (CD ROM), digital versatile disks (DVD) or other optical disk storage, magnetic cassettes, magnetic tape, magnetic disk storage or other magnetic storage devices, or any other medium capable of storing computer-readable instructions.

The computer 1000 may include or have access to a computing environment that includes an input interface 1025, an output interface 1030, and a communication interface 1035. The output interface 1030 may interface to or include a display device, such as a touchscreen, that also may serve as an input device. The input interface 1025 may interface to or include one or more of a touchscreen, a touchpad, a mouse, a keyboard, a camera, one or more device-specific buttons, one or more sensors integrated within or coupled via wired or wireless data connections to the computer 1000, and other input devices. The computer 1000 may operate in a networked environment using the communication interface 1035 to connect to one or more remote computers, such as database servers. The remote computer may include a personal computer (PC), server, router, network PC, peer device or other common network node, or the like. The communication interface 1035 may connect to a local-area network (LAN), a wide-area network (WAN), a cellular network, a WiFi network, a Bluetooth network, or other networks.

Computer instructions stored on a computer-readable medium (e.g., the program 1055 stored in the memory storage 1010) are executable by the processor 1005 of the computer 1000. A hard drive, CD-ROM, and RAM are some examples of articles including a non-transitory computer-readable medium such as a storage device. The terms "computer-readable medium" and "storage device" do not include carrier waves to the extent that carrier waves are deemed too transitory. "Computer-readable non-transitory media" includes all types of computer-readable media, including magnetic storage media, optical storage media, flash media, and solid-state storage media. It should be understood that software can be installed in and sold with a computer. Alternatively, the software can be obtained and loaded into the computer, including obtaining the software through a physical medium or distribution system, including, for example, from a server owned by the software creator or from a server not owned but used by the software creator. The software can be stored on a server for distribution over the Internet, for example.

The program 1055 is shown as including an impedance module 1060, a VIA design module 1065, and a fabrication module 1070. Any one or more of the modules described herein may be implemented using hardware (e.g., a processor of a machine, an application-specific integrated circuit (ASIC), a field programmable gate array (FPGA), or any suitable combination thereof). Moreover, any two or more of these modules may be combined into a single module, and the functions described herein for a single module may be subdivided among multiple modules. Furthermore, according to various example embodiments, modules described herein as being implemented within a single machine, database, or device may be distributed across multiple machines, databases, or devices.

The impedance module 1060 determines the impedance of a differential VIA for a circuit design. By comparing the results for different designs, the VIA design module 1065 selects a design having reduced reflections and a better impedance profile for fabrication. The fabrication module 1070 controls photolithographic and chemical processing steps, CNC machines, and other devices to fabricate multilayer circuits.

EXAMPLES

Example 1 is a multi-layer circuit comprising: a first circuit layer; a second circuit layer; a third circuit layer between the first circuit layer and the second circuit layer; a differential vertical interconnect access (VIA) connecting the first circuit layer and the second circuit layer, the differential VIA comprising at least two conductive elements for conducting a differential signal between the first circuit layer and the second circuit layer, the at least two conductive elements being surrounded by a single non-conductive region on the first circuit layer and the second circuit layer, the at least two conductive elements being surrounded by separate non-conductive regions on the third circuit layer.

In Example 2, the subject matter of Example 1 includes, wherein: the differential VIA comprises: a first VIA pad on the first circuit layer; and a second VIA pad on the second circuit layer; and the differential VIA lacks a VIA pad on the third circuit layer.

In Example 3, the subject matter of Examples 1-2 includes, a fourth circuit layer between the first circuit layer and the second circuit layer; wherein the at least two conductive elements are surrounded by a single non-conductive region on the fourth circuit layer.

Example 4 is a method comprising: fabricating a multilayer circuit comprising: a first circuit layer; a second circuit layer; a third circuit layer between the first circuit layer and the second circuit layer; a differential vertical interconnect access (VIA) connecting the first circuit layer and the second circuit layer, the differential VIA comprising at least two conductive elements for conducting a differential signal between the first circuit layer and the second circuit layer, the at least two conductive elements being surrounded by a single non-conductive region on the first circuit layer and the second circuit layer, the at least two conductive elements being surrounded by separate non-conductive regions on the third circuit layer.

In Example 5, the subject matter of Example 4 includes, wherein: the differential VIA comprises: a first VIA pad on the first circuit layer; and a second VIA pad on the second circuit layer; and the differential VIA lacks a VIA pad on the third circuit layer.

In Example 6, the subject matter of Examples 4-5 includes, determining an impedance for an alternative VIA connecting the first circuit layer and the second circuit layer, the alternative VIA comprising at least two conductive elements for conducting the differential signal between the first circuit layer and the second circuit layer, the at least two conductive elements being surrounded by a single non-conductive region on the first circuit layer, the second circuit layer, and the third circuit layer; wherein the multi-layer circuit is fabricated with the at least two conductive elements surrounded by separate non-conductive regions on the third circuit layer based on the determined impedance for the alternative VIA.

In Example 7, the subject matter of Example 6 includes, determining an impedance for the differential VIA; wherein the multi-layer circuit is fabricated with the at least two conductive elements surrounded by separate non-conductive regions on the third circuit layer further based on the determined impedance for the differential VIA.

In Example 8, the subject matter of Example 7 includes, wherein the determined impedance for the differential VIA has increased capacitance relative to the determined impedance for the alternative VIA.

In Example 9, the subject matter of Examples 6-8 includes, determining a size of the single non-conductive region based on the impedance for the alternative VIA.

In Example 10, the subject matter of Examples 4-9 includes, wherein the fabricating of the multi-layer circuit is part of fabricating a silicon die package.

In Example 11, the subject matter of Examples 4-10 includes, wherein the fabricating of the multi-layer circuit is part of fabricating a printed circuit board (PCB).

In Example 12, the subject matter of Example 11 includes, determining an impedance for a connection between an alternative PCB and a second PCB, the alternative PCB using an alternative VIA to connect the first circuit layer and the second circuit layer, the alternative VIA comprising at least two conductive elements for conducting the differential signal between the first circuit layer and the second circuit layer, the at least two conductive elements being surrounded by a single non-conductive region on the first circuit layer, the second circuit layer, and the third circuit layer; wherein the multi-layer circuit is fabricated with the at least two conductive elements surrounded by separate non-conductive regions on the third circuit layer based on the determined impedance for the connection between the alternative PCB and the second PCB.

Example 13 is a non-transitory machine-readable medium that stores instructions that, when executed by one or more processors, cause the one or more processors to perform operations comprising: fabricating a multi-layer circuit comprising: a first circuit layer; a second circuit layer; a third circuit layer between the first circuit layer and the second circuit layer; a differential vertical interconnect access (VIA) connecting the first circuit layer and the second circuit layer, the differential VIA comprising at least two conductive elements for conducting a differential signal between the first circuit layer and the second circuit layer, the at least two conductive elements being surrounded by a single non-conductive region on the first circuit layer and the second circuit layer, the at least two conductive elements being surrounded by separate non-conductive regions on the third circuit layer.

In Example 14, the subject matter of Example 13 includes, wherein: the differential VIA comprises a VIA pad on the first circuit layer and the second circuit layer without a VIA pad on the third circuit layer.

In Example 15, the subject matter of Examples 13-14 includes, wherein the operations further comprise: determining an impedance for an alternative VIA connecting the first circuit layer and the second circuit layer, the alternative VIA comprising at least two conductive elements for conducting the differential signal between the first circuit layer and the second circuit layer, the at least two conductive elements being surrounded by a single non-conductive region on the first circuit layer, the second circuit layer, and the third circuit layer; wherein the multi-layer circuit is fabricated with the at least two conductive elements surrounded by separate non-conductive regions on the third circuit layer based on the determined impedance for the alternative VIA.

In Example 16, the subject matter of Example 15 includes, determining an impedance for the differential VIA; wherein the multi-layer circuit is fabricated with the at least two conductive elements surrounded by separate non-conductive regions on the third circuit layer further based on the determined impedance for the differential VIA.

In Example 17, the subject matter of Example 16 includes, wherein the determined impedance for the differential VIA has increased capacitance relative to the determined impedance for the alternative VIA.

In Example 18, the subject matter of Examples 15-17 includes, determining a size of the single non-conductive region based on the impedance for the alternative VIA.

In Example 19, the subject matter of Examples 13-18 includes, wherein the fabricating of the multi-layer circuit is part of fabricating a silicon die package.

In Example 20, the subject matter of Examples 13-19 includes, wherein the fabricating of the multi-layer circuit is part of fabricating a printed circuit board (PCB).

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

The Abstract of the Disclosure is provided to comply with 37 C.F.R. § 1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:
1. A fabricated circuit comprising:
a silicon die;
a printed circuit board (PCB); and a substrate between the silicon die and the PCB, the substrate comprising:
a first circuit layer;
a second circuit layer;
a third circuit layer between the first circuit layer and the second circuit layer; and
a differential vertical interconnect access (VIA) connecting the first circuit layer and the second circuit layer, the differential VIA comprising at least two conductive elements for conducting a differential signal between the silicon die and the PCB, the at least two conductive elements being surrounded by a single non-conductive region on the first circuit layer and on the second circuit layer, the at least two conductive elements being surrounded by separate non-conductive regions on the third circuit layer.

2. The fabricated circuit of claim 1, wherein:
the differential VIA comprises:
a first VIA pad on the first circuit layer; and
a second VIA pad on the second circuit layer; and
the differential VIA lacks a VIA pad on the third circuit layer.

3. The fabricated circuit of claim 1, wherein the substrate further comprises:
a fourth circuit layer between the first circuit layer and the second circuit layer; wherein
the at least two conductive elements are surrounded by a single non-conductive region on the fourth circuit layer.

4. The fabricated circuit of claim 1, wherein the substrate is soldered to the PCB.

5. The fabricated circuit of claim 1, wherein the substrate is connected to the PCB via a socket.

6. The fabricated circuit of claim 1, wherein the silicon die is mounted to the substrate via controlled collapse chip connection (C4) bumps.

* * * * *